(12) United States Patent
Abadeer et al.

(10) Patent No.: US 7,358,823 B2
(45) Date of Patent: Apr. 15, 2008

(54) PROGRAMMABLE CAPACITORS AND METHODS OF USING THE SAME

(75) Inventors: Wagdi W. Abadeer, Jericho, VT (US); Anthony R. Bonaccio, Shelburne, VT (US); Jack A. Mandelman, Flat Rock, NC (US); William R. Tonti, Essex Junction, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 11/353,516

(22) Filed: Feb. 14, 2006

(65) Prior Publication Data

US 2007/0188249 A1 Aug. 16, 2007

(51) Int. Cl.
*H03B 5/12* (2006.01)
(52) U.S. Cl. .................... 331/177 V; 331/36 C
(58) Field of Classification Search ............ 331/177 V, 331/36 C
See application file for complete search history.

(56) References Cited

U.S. PATENT DOCUMENTS

| | | | | |
|---|---|---|---|---|
| 5,166,646 A | * | 11/1992 | Avanic et al. .......... 331/107 A |
| 5,220,194 A | * | 6/1993 | Golio et al. ................. 257/601 |
| 5,604,700 A | * | 2/1997 | Parris et al. ............. 365/185.1 |
| 5,989,963 A | * | 11/1999 | Luning et al. .............. 438/289 |
| 6,198,652 B1 | * | 3/2001 | Kawakubo et al. ......... 365/145 |
| 2001/0020861 A1 | * | 9/2001 | Hirose ........................ 327/284 |
| 2002/0140109 A1 | * | 10/2002 | Keshavarzi et al. ........ 257/782 |
| 2003/0048655 A1 | * | 3/2003 | El-Sharawy et al. ........ 365/149 |

* cited by examiner

*Primary Examiner*—Joseph Chang
(74) *Attorney, Agent, or Firm*—Dugan & Dugan

(57) ABSTRACT

In a first aspect, a first method of adjusting capacitance of a semiconductor device is provided. The first method includes the steps of (1) providing a transistor including a dielectric material having a dielectric constant of about 3.9 to about 25, wherein the transistor is adapted to operate in a first mode to provide a capacitance and further adapted to operate in a second mode to change a threshold voltage of the transistor from an original threshold voltage to a changed threshold voltage such that the changed threshold voltage affects a capacitance provided by the transistor when operated in the first mode; and (2) employing the transistor in a circuit. Numerous other aspects are provided.

5 Claims, 5 Drawing Sheets

PROGRAMMABLE CAPACITORS AND METHODS OF USING THE SAME

CROSS-REFERENCE TO RELATED APPLICATION

The present application is related to U.S. patent application Ser. No. 11/353,493, filed Feb. 14, 2006 and titled "MEMORY ELEMENTS AND METHODS OF USING THE SAME" which is hereby incorporated by reference herein in its entirety.

FIELD OF THE INVENTION

The present invention relates generally to semiconductor devices, and more particularly to programmable capacitors and methods of using the same.

BACKGROUND

A conventional transistor may be employed as a capacitor. A plurality of such transistors may be coupled to form an array of capacitors. However, a large amount of circuitry and additional process complexity are required to maintain a state of the capacitor array. Further, such a conventional transistor may not provide low leakage (e.g., voltage or capacitance leakage), a wide tuning range and be adapted to integrate easily into existing complementary metal-oxide-semiconductor field effect transistor (CMOS) processing. Accordingly, an improved capacitor and circuitry formed thereby, and methods of using the same are desired.

SUMMARY OF THE INVENTION

In a first aspect of the invention, a first method of adjusting capacitance of a semiconductor device is provided. The first method includes the step of providing a transistor including a dielectric material having a dielectric constant of about 3.9 to about 25. The transistor is adapted to operate in a first mode to provide a capacitance and further adapted to operate in a second mode to change a threshold voltage of the transistor from an original threshold voltage to a changed threshold voltage. The changed threshold voltage affects a capacitance provided by the transistor when operated in the first mode. The first method also includes the step of employing the transistor in a circuit.

In a second aspect of the invention, a first apparatus is provided. The first apparatus is a semiconductor device having an adjustable capacitance that includes a transistor formed on a substrate having a gate region including a dielectric material having a dielectric constant of about 3.9 to about 25. The transistor is adapted to (1) operate in a first mode to provide a capacitance; and (2) operate in a second mode to change a threshold voltage of the transistor from an original threshold voltage to a changed threshold voltage such that the changed threshold voltage affects a capacitance provided by the transistor when operated in the first mode.

In a third aspect of the invention, a first system is adapted to provide a variable capacitance. The first system is a circuit that includes at least one transistor including a dielectric material having a dielectric constant of about 3.9 to about 25. Each transistor is adapted to operate in a first mode to provide a capacitance. Further, each transistor is adapted to operate in a second mode to change a threshold voltage of the transistor from an original threshold voltage to a changed threshold voltage such that the changed threshold voltage affects a capacitance provided by the transistor when operated in the first mode. A capacitance provided by the circuit is based on the capacitance provided by each transistor. Numerous other aspects are provided in accordance with these and other aspects of the invention.

Other features and aspects of the present invention will become more fully apparent from the following detailed description, the appended claims and the accompanying drawings.

DETAILED DESCRIPTION

The present invention provides an improved capacitor and circuitry formed thereby, and methods of using the same. More specifically, the present invention may employ a transistor including a dielectric material having a dielectric constant of about 3.9 to about 25 as a capacitor. A threshold voltage of the transistor may be adjusted by applying a bias voltage to a gate of the transistor. In this manner, a capacitance of the transistor may be adjusted, and the transistor may be tuned to provide a desired capacitance. Such an adjustable capacitor may be employed in a variety of circuits. For example, such a capacitor may be used to adjust a frequency employed by a phase-locked loop (PLL).

Alternatively, in some embodiments, a plurality of such capacitors may be employed in a binary-weighted array of capacitors. A capacitance of such an array may be based on control signals (e.g., bits) asserted on one or more inputs of the array. For example, if a control signal is asserted on a first input of the array, a capacitance of the array may be based on a first set of capacitors, which are coupled to the first input, included in the array. Alternatively, if a control signal is asserted on a second input of the array, the capacitance of the array may be based on a second set of capacitors, which are coupled to the second input, included in the array and so on. A capacitance of such an array may further be based on programming signals coupled to the array. Such programming signals may be employed to adjust threshold voltages of one or more transistors of the array, thereby affecting respective capacitances subsequently provided by such transistors, and therefore the capacitance of the array. The control signals may serve as a coarse adjustment and the programming signals may serve as a fine adjustment of capacitance provided by the array, or vice versa.

In this manner, the present invention may provide a capacitor whose capacitance may be varied and circuitry formed thereby, and methods of using the same.

Figure 1:
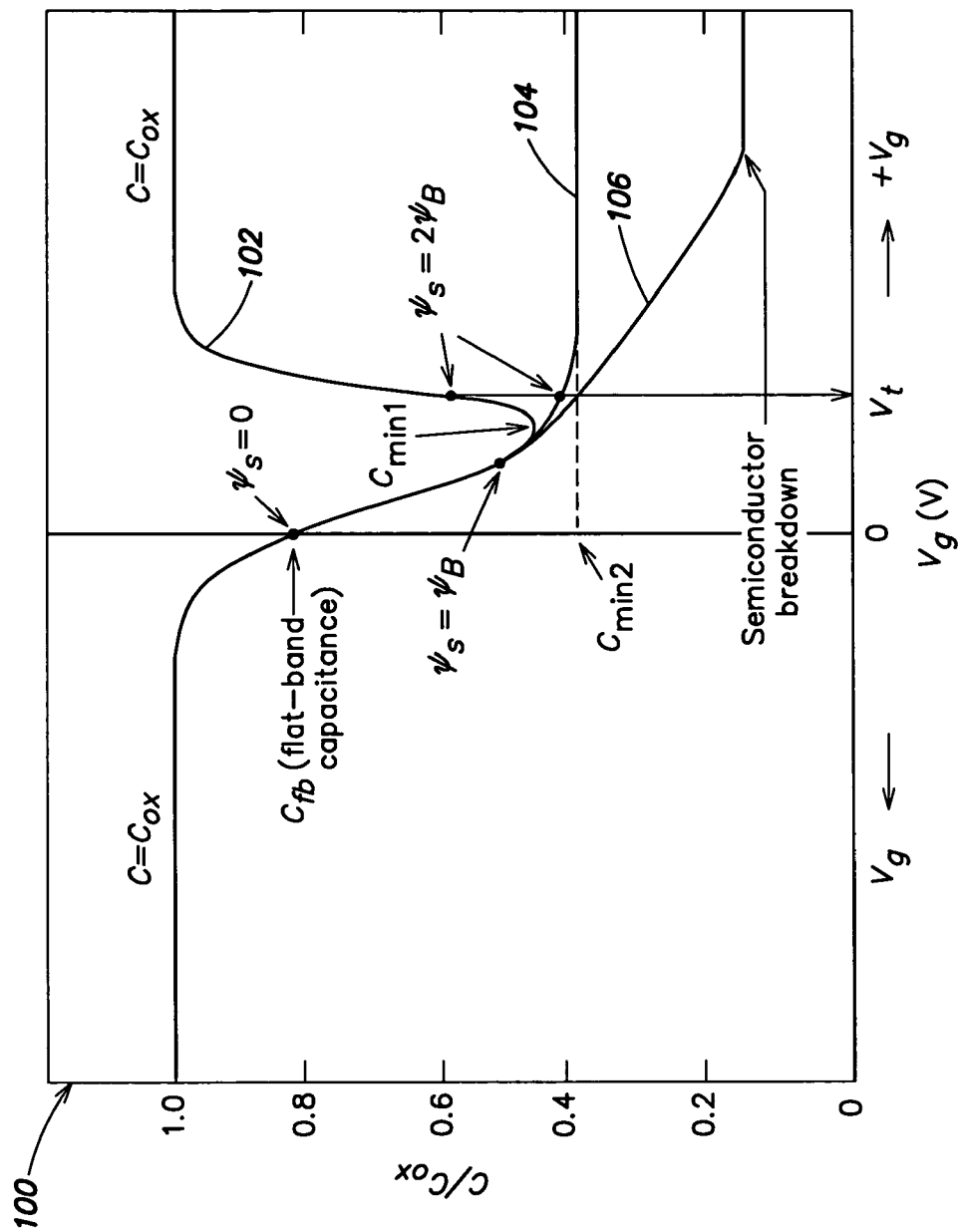
FIG. 1 is a graph illustrating a relationship between capacitance ratio and voltage.

FIG. 1 is a graph illustrating a relationship between capacitance ratio and voltage. A conventional metal-oxide-semiconductor field-effect transistor (MOSFET) (e.g., which may be an n-channel MOSFET (NFET)) formed on a substrate may be employed as a capacitor, which may provide a capacitance C, by applying a voltage Vg to a gate of the MOSFET while grounding the substrate and a source and drain of the MOSFET. With reference to FIG. 1, the graph 100 illustrates a relationship between a capacitance-to-gate dielectric capacitance per unit area ratio (C/Cox) and a voltage Vg applied to the MOSFET gate for a capacitor under different conditions. For example, a first curve 102 of the graph 100 illustrates the relationship between C/Cox and Vg for the MOSFET, a second curve 104 of the graph 100 illustrates the relationship if source/drain diffusion regions are no longer present and a third curve 106 of the graph 100 illustrates the relationship if the MOSFET undergoes deep depletion. The capacitance described by the curves 102, 104, 106 is representative of a small signal measurement superimposed upon a transient or DC bias value.

Capacitance provided by the MOSFET depends on a gate-to-diffusion region bias as follows. The first curve 102 may apply to MOSFETs employed in accordance with an embodiment of the present invention. For example, the first curve 102 may illustrate low frequency operation in which an approximately unlimited supply of minority carriers (e.g., electrons) may be available to a channel region of the MOSFET from the adjacent source/drain diffusion regions of the MOSFET. Accumulation may refer to a condition in which depletion does not occur in a top surface of the substrate. Therefore, a top surface of silicon of the MOSFET is a P-type material. With reference to the first curve 102, while in accumulation with a negative gate voltage Vg applied to the NFET, and the substrate, source and drain grounded, the NFET may provide a gate capacitance C equal to the gate dielectric capacitance per unit area Cox. As shown, when the NFET, which is employed as a capacitor, is biased far enough into accumulation by application of negative gate bias Vg, a change in Vt may not change the capacitance C provided by the NFET from Cox.

When the gate bias voltage Vg is 0, the NFET is at flat band and provides a flat-band capacitance $C_{fb}$. At flat band, a surface potential $\Psi_s$ is 0. From this point, an increasingly positive gate bias voltage Vg may cause silicon depletion to expand, thereby decreasing capacitance provided by the NFET. As the capacitance decreases while an increasingly positive gate bias voltage Vg is applied to the NFET, the surface potential $\Psi_s$ may equal $\Psi_B$ which is the difference between Fermi level and intrinsic level. Once maximum depletion depth is reached, a minimum capacitance $C_{min1}$ provided by the NFET may be reached. From this point of the first curve 102, an increase in gate bias voltage Vg may cause an inversion layer to form (e.g., quickly) from carriers in the source/drain diffusion regions of the NFET. Consequently, the capacitance C provided by the NFET may increase toward Cox. When the gate bias voltage is increased to a threshold voltage (Vt) of the NFET, $\Psi_s$ may equal $2 \times \Psi_B$.

Alternatively, if source/drain diffusion regions are no longer present, in the absence of minority carrier generation, a capacitance (e.g., steady state capacitance) provided by the NFET may follow the second curve 104 to reach a minimum capacitance $C_{min2}$. While reaching $C_{min2}$, as the gate bias voltage is increased to a Vt of the NFET, $\Psi_s$ may equal $2 \times \Psi_B$. However, thermal generation of minority carriers may cause a surface of the silicon to be partially populated with an n-type material, thereby forming a weak inversion layer. Consequently, the capacitance provided by the NFET may increase slightly (from that shown in the second curve 104) as the gate bias voltage Vg increases.

Alternatively, an abrupt increase in gate bias voltage Vg may cause the NFET to enter deep depletion. As illustrated by the third curve 106, the capacitance provided by the NFET may decrease until a voltage at which semiconductor breakdown is reached. Alternatively, under deep depletion conditions, the capacitance provided by the NFET may at first decrease. However, thereafter, carrier generation may cause the capacitance provided by the NFET to increase to a steady state capacitance which is less than Cox.

The present invention employs a MOSFET (e.g., an NFET) including a dielectric material having a high dielectric constant (hereinafter represented as "k" or "$\in_d$"), such as HfSiO and/or the like. For example, the MOSFET may include dielectric material having a k between about that of SiO2 (e.g., 3.9) and about that of HfO2 (e.g., 25) depending on the exact chemical composition (although MOSFETs in accordance with an embodiment of the present invention may including dielectric material having a k within a larger or smaller and/or different range). As described in U.S. patent application Ser. No. 11/353,493, filed Feb. 14, 2006 and titled "MEMORY ELEMENTS AND METHODS OF USING THE SAME", which is hereby incorporated by reference herein in its entirety, a MOSFET including such a high-k dielectric material may operate in a first mode (e.g., a functional mode) to store data and operate in a second mode (e.g., a programming mode) to change a Vt of the MOSFET from an original Vt to a changed Vt such that the changed Vt affects data stored by the memory element when operated in the first mode. For example, the MOSFET may be operated in the second mode by applying a gate bias voltage of about +2.0 V or about +2.5 V for less than about 1 second. However, a larger or smaller and/or different gate bias voltage may be employed. Additionally, the gate bias voltage may be applied to the MOSFET for a longer or shorter time period. In this manner, an original Vt of the MOSFET may be adjusted to the changed Vt, which may be higher than the original Vt without any other form of device degradation. The original Vt may be restored or nearly restored by application of a negative gate bias voltage (e.g., −2.0 V) for a time period (e.g., less than 1 second) without inducing device degradation. Consequently, the original Vt may be recoverable. Additional details operating the MOSFET to store data are described in U.S. patent application Ser. No. 11/353,493, filed Feb. 14, 2006 and titled "MEMORY ELEMENTS AND METHODS OF USING THE SAME", which is hereby incorporated by reference herein in its entirety, and therefore, are not described in detail herein.

Such a MOSFET formed on a substrate may provide a capacitance when a bias voltage is applied to a gate of the MOSFET, and the substrate, source and drain of the MOSFET are grounded. The capacitance provided by the MOSFET is based on the Vt thereof. Consequently, the MOSFET may be operated in the first mode as a capacitor while having a first Vt (e.g., the original Vt), thereby providing a first capacitance. Thereafter, the MOSFET may be operated in the second mode such that the Vt of the MOSFET is adjusted from the first Vt to a second Vt (e.g., a first changed Vt). Subsequently, the MOSFET may be operated in the first mode while having the second Vt, thereby providing a second capacitance. Additionally, the MOSFET may be operated in the second mode such that the Vt of the MOSFET is adjusted from the second Vt to a third Vt (e.g., a second changed Vt), which may be equal to or approximately equal to the first Vt. Thereafter, the MOSFET may be operated in the first mode while having the third Vt, thereby providing a third capacitance which may be approximately equal to the first capacitance.

For example, the MOSFET may be operated in the first mode as a capacitor while having the original Vt, thereby providing a first gate capacitance Cg1. To provide the first gate capacitance Cg1, a first voltage Vg1 may be applied to the gate of the MOSFET. The first gate voltage Vg1 may be selected from the portion of the first curve 102 in which C/Cox declines (e.g., rapidly). For example, a gate bias voltage of about 0 V to about a voltage at which $C_{min1}$ is reached may be selected (although the gate bias voltage may be selected from a larger or smaller and or different range). Because the selected gate bias voltage corresponds to a rapidly changing portion of the first curve 102, in some embodiments, a highly regulated power supply may be employed to provide Vg1, thereby reducing and/or eliminating variation of capacitance provided by the MOSFET. For a selected Vg1, a first gate capacitance Cg1 provided by the MOSFET may be determined using the following formula:

$$Cg1 = Cox/\{1+[2 \times Cox^2 \times Vg1/(\in_{si} \times Q \times N_a)]\}^{0.5},$$

where Cox is the capacitance/unit area for the high-k gate dielectric, $\in_{si}$ is the dielectric constant for silicon, Q is charge of an electron in Coulombs and $N_a$ is acceptor impurity density in P-type silicon. The capacitance/unit area may be determined using the following formula:

$$Cox = \in_o \times \in_d / tox,$$

where $\in_o$ is the vacuum permittivity which is equal to $8.85 \times 10^{-14}$ F/cm, $\in_d$ is the relative dielectric constant for the high-k dielectric and tox is a thickness of the high-k dielectric. Therefore, Cg1 may represent an operational capacitance of the NFET before a Vt thereof is changed. Therefore, a capacitance provided by a circuit comprising the MOSFET may be based on Cg1.

The MOSFET may be operated in second mode to change a Vt thereof. For example, a gate bias voltage or stress Vg2 of about +2.5 V may be applied to the MOSFET for a time t1 of about less than 1 second to cause a threshold voltage change ΔVt in the MOSFET. For example, the Vt may be increased from the original Vt to the first changed Vt. Such a ΔVt may shift the first curve 102 to the right. More specifically, a trapped negative charge in the gate dielectric of the MOSFET may cause +ΔVt, which may be mirrored as positive charge in a surface of silicon of the MOSFET. Consequently, after the threshold voltage change, a larger gate voltage may be required to achieve a desired depletion level than the gate voltage required to obtain such depletion level before the threshold voltage shift. Therefore, after inducing the ΔVt, when the MOSFET is operated in the first mode as a capacitor while having the first changed Vt, in response to the original gate bias voltage of Vg1, the MOSFET may provide a second gate capacitance Cg2 which may be larger than the first gate capacitance Cg1. For the selected Vg1, the second gate capacitance Cg2 provided by the MOSFET may be determined using the following formula:

$$Cg2 = Cox/\{1+[2 \times Cox^2 \times (Vg1-\Delta Vt)/(\in_{si} \times Q \times N_a)]\}^{0.5}.$$

By adjusting a value of the gate bias voltage Vg2 applied to the MOSFET and/or a time period that such a voltage is applied to the MOSFET while operating in the second mode, a desired ΔVt may be obtained. Consequently, a desired second gate capacitance Cg2 may be obtained. In this manner, a capacitance provided by one or more such MOSFETs (and therefore provided by a circuit comprising one or more such MOSFETs) may be adjusted (e.g., tuned in for RF circuits and/or increased for decoupling).

Using the formulas above, for a MOSFET including a dielectric material having an $\in_d = 15$ and for $N_a = 5 \times 10^{15}/cm^3$, Vg1=0.5 V and Cox=33.19 fF/μm² the MOSFET may provide a first capacitance Cg1=0.009×Cox=0.3 fF/μm². Alternatively, by decreasing Vg1 to about 0.1 V, the first capacitance Cg1 provided by the MOSFET may be increased to about 0.7 fF/μm².

By causing the Vt of the MOSFET to change by about 80 mV, the MOSFET may provide a second capacitance Cg2 of about 1.44 fF/μ² for a Vg1 of about 0.1 V, which is about twice the first capacitance. However, the second capacitance Cg2 may be increased by causing a larger ΔVt.

However, a greater disparity between capacitance provided by a MOSFET employed as a capacitor before and after a threshold voltage change may be achieved using a gate bias voltage Vg1 of 0 V than other gate bias voltages. At Vg1=0 V, the MOSFET operates in a flat-band condition. A capacitance Cg3 provided by the MOSFET while operating in this condition is the flat-band capacitance $C_{fb}$, and may be determined using the following formula:

$$1/Cg3 = (1/Cox) + \{[\in_{si} - K \times T/(Q^2 \times N_a)]^{0.5}/\in_{si}\},$$

where K is Boltzmann's constant which equals to $1.3806505 \times 10^{-23}$ Joules/Kelvin and T is the absolute temperature in Kelvin and ΔVt is about 80 mV. For example, using the above formula, at 30° C., a MOSFET having an original Vt may provide a flat-band capacitance Cg3 of 1.7 fF/μm². After inducing a ΔVt of about 80 mV, when the MOSFET is operated in the first mode as a capacitor while having the changed Vt, in response to the original gate bias voltage of Vg1=0 V, the MOSFET may provide a second gate capacitance Cg4, which may be in the accumulation range of the first curve 102 and may be larger that Vg3 (and Vg2). The second gate capacitance Cg4 in a flat-band condition provided by the MOSFET may be determined using the following formula:

$$Cg4 = Cox/\{1+[2 \times K \times T/(Q \times |Vg - \Psi_s|)]\}$$

Figure 2:
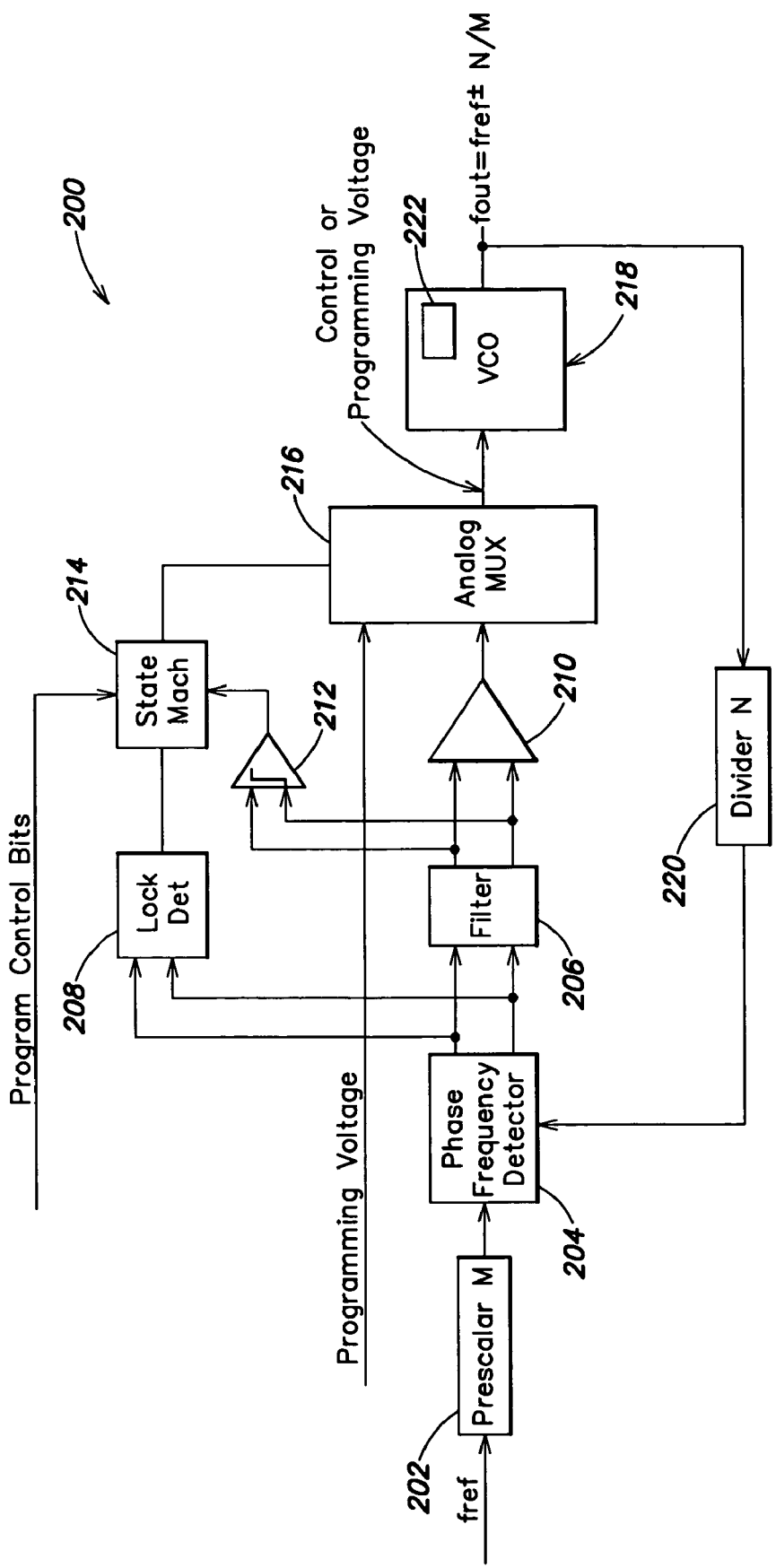
FIG. 2 is a schematic diagram of a phase-locked loop (PLL) including a programmable capacitor in accordance with an embodiment of the present invention.

Using the above methods, in accordance with embodiments of the present invention, one or more such MOSFETs may be employed as capacitors which may provide a programmable (e.g., an adjustable or variable) capacitance (e.g., varactors) in a plurality of circuits. For example, adjustable capacitors may be employed in many applications of analog circuit design. As described in detail below, such adjustable capacitors (e.g., varactors) may be employed to tune a differential LC-tank oscillator circuit adapted to provide a proper frequency (e.g., a proper center frequency) when operating in a phase-locked loop (PLL). For example, FIG. 2 is a block diagram of a PLL 200 including a programmable capacitor in accordance with an embodiment of the present invention. With reference to FIG. 2, the PLL 200 may be similar to a conventional PLL. However, in contrast to the conventional PLL, one or more components of the PLL 200 may include transistors including a dielectric material having a dielectric constant of about 3.9 to about 25 as capacitors which may provide a programmable capacitance in the manner described above. Further, in contrast to a conventional PLL, as described below, the PLL 200 may include a multiplexer adapted to receive a control signal output from a state machine, and a programming voltage that may be employed to adjust a Vt of such a transistor. The multiplexer may selectively output the programming voltage to the transistor based on the control signal.

For example, the PLL 200 may include a prescalar M circuit (e.g., logic) 202 coupled to a phase frequency detector circuit 204. The prescalar M circuit 202 may be adapted to receive a signal fref as input and output a signal having a frequency 1/M times that of fref therefrom. Such a signal output from the prescalar M circuit 202 may serve as a first signal, which may be a known reference signal, and may be input by the phase frequency detector circuit 204. The phase frequency detector circuit 204 may be coupled a filter 206 and a lock detection circuit 208 adapted to determine whether the PLL 200 has locked and output a signal accordingly. More specifically, one or more signals output by the phase frequency circuit 204 may be input by the filter 206 and a lock detection circuit 208. Similarly, the filter 206 may be coupled to a control voltage buffer circuit 210 and a voltage comparator 212 adapted to determine whether the control voltage of the PLL 200 is greater than or equal to a predetermined value (e.g., 0 V). More specifically, one or more signals output by the filter 206 may be input by the control voltage buffer circuit 210 and the voltage comparator 212.

The lock detection circuit 208 and the voltage comparator 212 may be coupled to a state machine 214. More specifically, a signal output by the lock detection circuit 208 and/or a signal output by the voltage comparator 212 may be input by the state machine 214. Further, the state machine 214 may also receive a signal including programming control bits as input. The state machine 214 may output a control voltage selection bit based on the signal output by the lock detection circuit 208 and the signal output by the voltage comparator 212. For example, the state machine 214 may output the program control bits if the signal output by the lock detection circuit 208 indicates the PLL 200 has locked a frequency and the voltage comparator outputs a signal indicating the control voltage of the PLL 200 is not greater than or equal to the predetermined value. Further, the state machine 214 and control voltage buffer circuit 210 may be coupled to an analog multiplexer 216. More specifically, a signal (e.g., the control voltage of the PLL 200) output by the control voltage buffer circuit 210 or a signal (e.g., the program control bits) output by the state machine 214 may be input by the analog multiplexer 216. Further, the analog multiplexer 216 may receive a programming voltage signal as input. The analog multiplexer 216 may selectively output a signal input by the multiplexer 216 based on the signal output by the state machine, which may serve as a control signal of the multiplexer 216. The analog multiplexer 216 may be coupled to a voltage-controlled oscillator (VCO) 218 in accordance with an embodiment of the present invention. More specifically, one or more signals output by the analog multiplexer 216 may input by the VCO 218. Such signals may be a control voltage and/or a programming voltage. The VCO 218 may be coupled to a divider N circuit 220. More specifically, a signal output by the VCO 218 may be input by the divider N circuit 220. The divider N circuit 220 may divide a frequency of the signal input by the circuit 220 (received from the VCO 218) to create and output a second signal having a frequency 1/N times that of the signal input by the circuit 220. The divider N circuit 220 may be coupled to the phase frequency detector circuit 204. More specifically, the second signal output by the divider N circuit 220 may be input by the phase frequency detector 204.

Similar to a conventional PLL, the PLL 200 is adapted to adjust (e.g., continuously) a frequency and phase of the second signal until the frequency and phase of the second signal matches the frequency and phase of the first signal. The signal output by the VCO 218 may serve as an output fout, which equals fref times N/M, of the PLL 200 when the frequency and phase of the second signal matches the frequency and phase of the first signal, where N and M are integers which typically range from 1 to 1024 but may take on other values as well. Structure and function of the prescalar M circuit 202, phase frequency detector circuit 204, filter 206, lock detection circuit 208, control voltage buffer circuit 210, voltage comparator 212 and divider N circuit 220 may be the same as corresponding circuit of a conventional PLL. Therefore, such circuitry 202-212, 220 is not described in further detail herein.

A VCO of a conventional PLL may be adapted to output a signal having a frequency based on (e.g., proportional to) a control signal (e.g., voltage) input by the VCO. The VCO may include one or more conventional capacitors, and the control voltage input by the VCO may modify a capacitance in the VCO which affects the frequency of the VCO output signal. However, during operation of the conventional PLL, the control voltage may be limited (e.g., to a value). Therefore, a capacitance in the VCO by the control voltage may be limited, and a frequency of the VCO output signal may be limited. Further, such limitations may be due in part to random variations in processing and difficult to predict during the design of the VCO. Consequently, due to such inflexibility of the conventional PLL, the control voltage may be insufficient to enable the VCO to output a signal having a frequency and phase such that the conventional PLL may create a second signal having a frequency and phase that matches that of a first signal (e.g., a reference signal).

In contrast to the VCO of a conventional PLL, the VCO 218 may include one or more of the varactors 222 described above (e.g., varactors including dielectric material having a k of about 3.9 to about 25). Further, the VCO 218 may be adapted to receive a control voltage signal or a programming voltage signal. During operation of the PLL 200, the control voltage signal may be applied to the VCO 218. More specifically, the control voltage signal may be applied to at least one of the varactors 222 such that a first capacitance is created in the VCO 218 which may affect a frequency of the VCO output signal, and therefore, affects a frequency and phase of the second signal generated by the PLL 200 that should match the frequency and phase of the first signal.

If the PLL 200 is unable to lock the frequency and phase of the second signal to the first signal using the control voltage, the programming voltage signal may be applied to the VCO 218. More specifically, the programming voltage signal may be applied to at least one of the varactors 222 such that respective Vts of such varactors change (e.g., from an original Vt to a changed Vt) in the manner described above). Consequently, thereafter, when the control voltage signal is applied to at least one of the varactors 222, a second different (e.g., larger) capacitance is created by the VCO 218. The second capacitance may affect the frequency of the VCO output signal, and therefore, may affect a frequency of the second signal generated by the PLL 200 such that the PLL 200 may lock the frequency and phase of the second signal to the frequency and phase of the first signal. In this manner, the same control voltage, which was insufficient to lock the frequency and phase of the second signal to the frequency and phase of the first signal before programming (e.g., causing a Vt change in) at least one varactor 222, may be applied to at least one programmed varactor 222 to successfully lock the frequency and phase of the second signal to the frequency and phase of the first signal. In this manner, the PLL 200 provides greater independence of random variations in capacitance due to processing than a conventional PLL.

Figure 3:
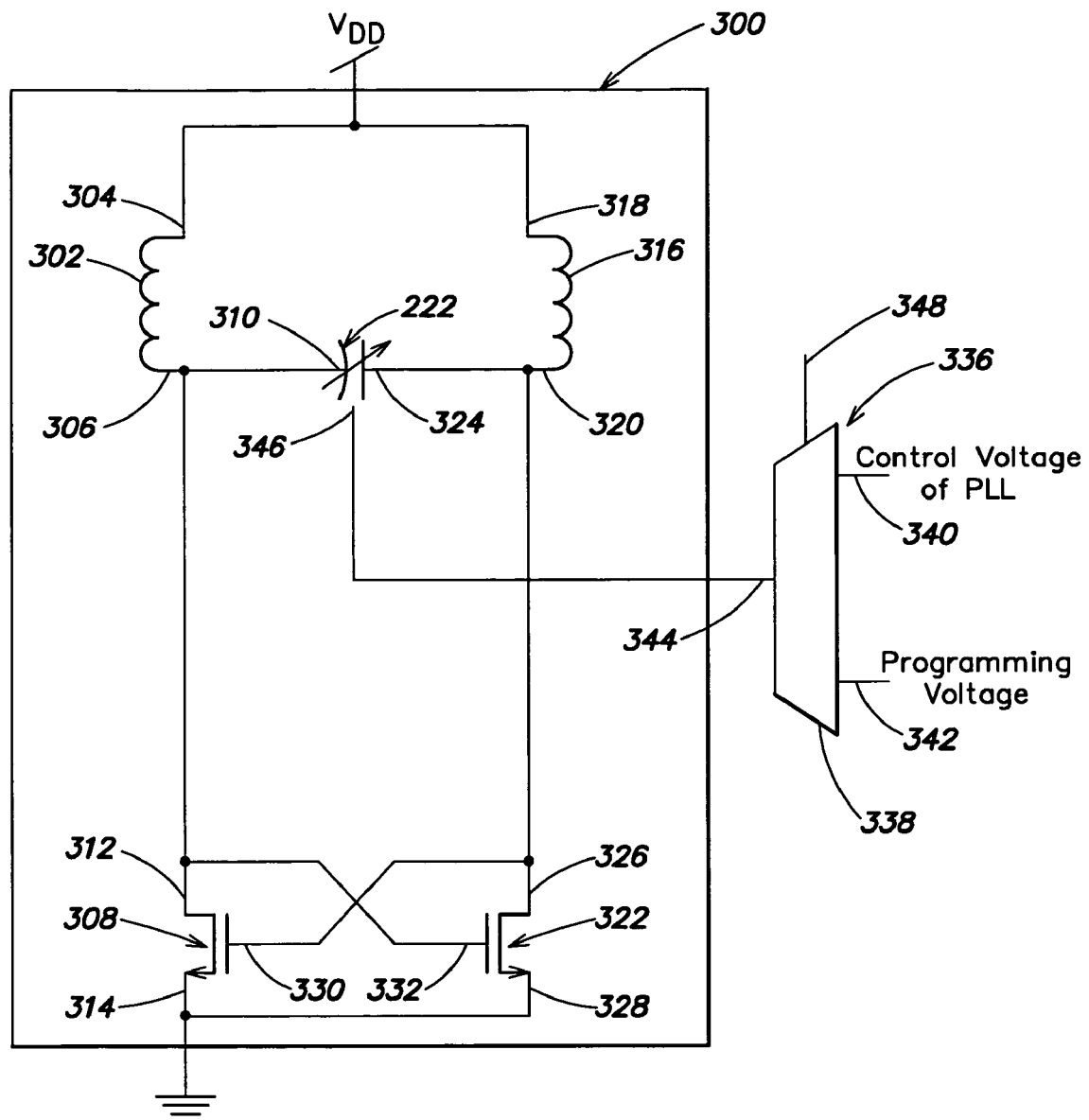
FIG. 3 is a schematic diagram of a first exemplary voltage-controlled oscillator (VCO) included in the PLL in accordance with an embodiment of the present invention.

The VCO 218 in accordance with embodiments of the present methods and apparatus may have a plurality of configurations. Exemplary circuits which may serve as the VCO 218 are described below with reference to FIGS. 3 and 4 which are block diagrams of first and second exemplary voltage-controlled oscillators (VCO) 300, 400, respectively, included in the PLL 200 in accordance with an embodiment of the present invention. With reference to FIG. 3, the VCO 300 may include a first inductor 302 having a first input 304 coupled to a power supply such as $V_{DD}$. A second input 306 of the first inductor 302 may be coupled to a varactor 222 and a first MOSFET (e.g., NFET) 308. More specifically, the second input 306 of the first inductor 302 may be coupled to a first terminal 310 of the varactor 222 and a drain or source terminal 312 of the first NFET 308. A source or drain terminal 314 of the first NFET 308 may be coupled to a power supply such as ground. Although varactor 222 is shown as a single varactor, in some embodiments, varactor 222 may comprise two discrete series varactors with the control voltage connected to the common point between such varactors.

Similarly, the VCO 300 may include a second inductor 316 having a first input 318 coupled to a power supply such as $V_{DD}$. A second input 320 of the second inductor 316 may be coupled to the varactor 222 and a second MOSFET (e.g., NFET) 322. More specifically, the second input 320 of the second inductor 316 may be coupled to a second terminal 324 of the varactor 222 and a drain or source terminal 326 of the second NFET 322. A source or drain terminal 328 of the second NFET 322 may be coupled to a circuit power supply such as ground. Further, a gate 330 of the first NFET 308 may be coupled to the second input 320 of the second inductor 316 and the drain or source terminal 326 of the second NFET 332. Similarly, a gate 332 of the second NFET 322 may be coupled to the second input 306 of the first inductor 302 and the drain or source terminal 312 of the first NFET 308. Inductor inputs 306, 320 or the potential between them may serve as an output of the first exemplary VCO 300.

Further, the first exemplary VCO 300 may be coupled to varactor control circuitry 336 adapted to operate the varactor 222 in a first mode to provide a capacitance and a second mode to change a threshold voltage of the varactor 222 from an original threshold voltage to a changed threshold voltage such that the changed threshold voltage affects a capacitance provided by the varactor 222 when operated in the first mode. For example, the varactor control circuitry 336 may be or include a multiplexer 338. The control voltage of the PLL 200 may be applied to the first input 340 of the multiplexer 338. As described above, the control voltage may be employed to lock the frequency and phase of the second signal to the frequency and phase of the first signal. Further, a programming voltage may be applied to a second input 342 of the multiplexer 338. The programming voltage may be employed to change a Vt of the varactor 222 (e.g., from an original Vt to a changed Vt). An output 344 of the multiplexer 338 may be coupled to a gate terminal 346 of the varactor 222. Additionally, the multiplexer 338 may include a third input 348 adapted to receive a multiplexer control signal. The multiplexer 338 is adapted to selectively output the control voltage or the programming voltage to the gate terminal 346 of the varactor 222 based on the multiplexer control signal. For example, the analog multiplexer 216 may serve as one or more portions of the varactor control circuitry 336. In such embodiments, the control voltage output by the control voltage buffer circuit 210 may be applied on the first input 340, the programming voltage may be applied on the second input 342 and the signal output by the state machine 214 may be input on the third input 348. The configuration of the VCO 300 is exemplary, and therefore, the VCO 300 may include a different circuitry adapted to function as described below.

During operation of the PLL 300 to lock the frequency and phase of the second signal to the frequency and phase of the first signal, the varactor control circuitry 336 may apply the control voltage to the gate terminal 346 of the varactor 222. Alternatively, the varactor control circuitry 336 may apply the programming voltage to the gate terminal 346 of the varactor 222 to program the varactor 222. Application of the programming voltage may not be allowed to happen during PLL operation. Rather, the programming voltage may be applied during a separate calibration or adjustment phase in which the PLL is not functioning as a loop. For example, assuming the Vt of the varactor 222 is the original Vt, if the first exemplary VCO 300 is unable to lock the frequency and phase of the second signal to (e.g., within a predetermined distance from) the frequency and phase of the first signal using the control voltage, the varactor control circuitry 336 may be employed to program the varactor 222. Thereafter, the varactor control circuitry 336 may be employed to apply the control voltage to the gate terminal 346 of the programmed varactor 222 such that the PLL 300 may lock the frequency and phase of the second signal to the frequency and phase of the first signal using the control voltage.

Exemplary design and use of a varactor 222 including a dielectric material having a dielectric constant of about 3.9 to about 25 in a PLL 200 (e.g., in a VCO 218, 300 of the PLL 200) is described below. For example, during circuit design, a varactor 222 may be designed for the VCO 218, 300 such that a capacitance provided thereby is always below the desired minimum value given all process variation effects. During circuit testing, the PLL 200, which includes the varactor 222, prescalar M circuit 202 and divider N circuit 220 which may be used in a final PLL design, is locked to a reference frequency in a manner similar to that during normal operation of the PLL 200. Because the varactor 222 may be designed to be too small, a frequency generated by the VCO 218 may be too high, and therefore, a sign of the control voltage applied to the VCO 218 may be negative to compensate (e.g., assuming a differential control voltage signal). Thereafter, a programming voltage may be applied to the varactor 222 (e.g., via a multiplexer 216, 338) to change the Vt of varactor 222, and therefore, change a capacitance provided thereby. A programming voltage amplitude and a time period (controlled by program control bits) that such a programming voltage is applied to the varactor may be adjusted such that a desired change in capacitance (e.g., about less than a 1% capacitance change) may be achieved which may enable the PLL to continue to lock. The steps of locking the PLL to a reference frequency and applying a programming voltage to the varactor may be repeated as necessary until a sign of the control voltage is observed to change. At this point the varactor capacitance has been adjusted to set the oscillator to the desired center frequency.

Figure 4:
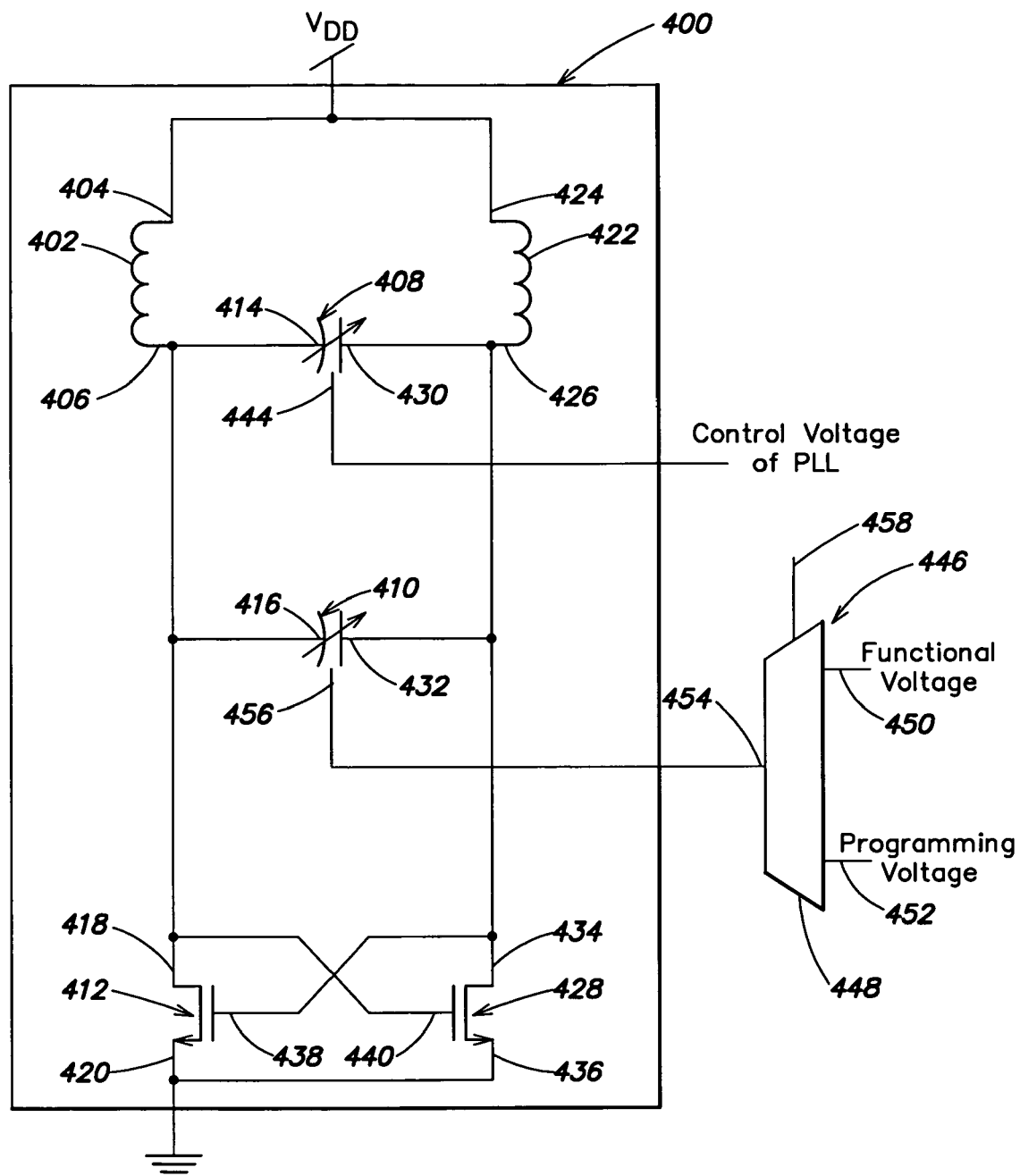
FIG. 4 is a schematic diagram of a second exemplary VCO included in a modified version of the PLL in accordance with an embodiment of the present invention.

FIG. 4 is a block diagram of a second exemplary VCO 400 included in a modified version of the PLL 200 in accordance with an embodiment of the present invention. In the modified version of the PLL 200, rather than coupling to the analog multiplexer 216, the output of the control voltage buffer circuit 210 may be coupled to and input by the VCO

218. Further, in addition to the programming voltage, the analog multiplexer 216 may receive a functional voltage as input. With reference to FIG. 4, the VCO 400 may include a first inductor 402 having a first input 404 coupled to a power supply such as $V_{DD}$. A second input 406 of the first inductor 402 may be coupled to a first varactor 408, a second varactor 410 and a first MOSFET (e.g., NFET) 412. The second varactor 410 may be similar to varactors described above (e.g., varactors including a dielectric material having a k of about 3.9 to about 25). Additionally, in some embodiments, the first varactor 408 may also be similar to varactors described above. More specifically, the second input 406 of the first inductor 402 may be coupled to a first terminal 414 of the first varactor 408, a first terminal 416 of the second varactor 410 and a drain or source terminal 418 of the first NFET 412. A source or drain terminal 420 of the first NFET 412 may be coupled to a power supply such as ground.

Similarly, the VCO 400 may include a second inductor 422 having a first input 424 coupled to a power supply such as $V_{DD}$. A second input 426 of the second inductor 422 may be coupled to the first varactor 408, second varactor 410 and a second MOSFET (e.g., NFET) 428. More specifically, the second input 426 of the second inductor 422 may be coupled to a second terminal 430 of the first varactor 408, a second terminal 432 of the second varactor 410 and a drain or source terminal 434 of the second NFET 428. A source or drain terminal 436 of the second NFET 428 may be coupled to a power supply such as ground. Further, a gate 438 of the first NFET 412 may be coupled to the second input 426 of the second inductor 422, the second input 430 of the first varactor 408, the second input 432 of the second varactor 410 and the drain or source terminal 434 of the second NFET 428. Similarly, a gate 440 of the second NFET 428 may be coupled to the second input 406 of the first inductor 402, the first input 414 of the first varactor 408, the first input 416 of the second varactor 410 and the drain or source terminal 418 of the first NFET 412. Inductor inputs 406, 426, or the potential between them may serve as an output of the second exemplary VCO 400. A gate terminal 444 of the first varactor 408 may be coupled to the control voltage signal of the modified version of the PLL 200. Further, the second exemplary VCO 400 may be coupled to varactor control circuitry 446 adapted to operate the second varactor 410 in a first mode to provide a capacitance and a second mode to change a threshold voltage of the second varactor 410 from an original threshold voltage to a changed threshold voltage such that the changed threshold voltage affects a capacitance provided by the second varactor 410 when operated in the first mode. For example, the varactor control circuitry 446 may be or include a multiplexer 448. A functional voltage of the modified version of the PLL 200 may be applied to the first input 450 of the multiplexer 448. The functional voltage may be a DC voltage whose value may be appropriate for the loop and may be distinct from the control voltage. The functional voltage may be employed to lock the frequency and phase of the second signal to the frequency and phase of the first signal. Further, a programming voltage may be applied to a second input 452 of the multiplexer 448. The programming voltage may be employed to change a Vt of the second varactor 410 (e.g., from an original Vt to a changed Vt). An output 454 of the multiplexer 448 may be coupled to a gate terminal 456 of the second varactor 410. Additionally, the multiplexer 448 may include a third input 458 adapted to receive a multiplexer control signal. For example, the analog multiplexer 216 of the modified version of the PLL 200 may serve as one or more portions of the varactor control circuitry 446. In such embodiments, the functional voltage may be applied on the first input 450, the programming voltage may be applied on the second input 452 and the signal output by the state machine (e.g., the control voltage selection bit) may be input on the third input 348. The multiplexer 448 is adapted to selectively output the functional voltage or the programming voltage to the gate terminal 456 of the second varactor 410 based on the multiplexer control signal.

During operation of the modified version of the PLL 200 to lock the frequency and phase of the second signal to the frequency and phase of the first signal, the first varactor 408 may serve as a tuning varactor and the second varactor 410 may serve to set a center frequency of the VCO 400. For example, the control voltage may be applied to the first varactor 408 such that the first varactor 408 provides a first capacitance. Further, the varactor control circuitry 446 may apply the functional voltage to the gate terminal 456 of the second varactor 410 such that the second varactor 410 provides a second capacitance, which may be the same as or different than the first capacitance. An overall capacitance created in the VCO 400 may be based on the first and second capacitances. The overall capacitance may affect a frequency of the VCO output signal, and therefore, may affect a frequency and phase of the second signal generated by the modified version of the PLL 200 that should match the frequency and phase of the first signal.

Alternatively, the varactor control circuitry 446 may apply the programming voltage to the gate terminal 456 of the second varactor 410 to program the second varactor 410. For example, assuming the Vt of the second varactor 410 is the original Vt, if the second exemplary VCO 400 is unable to lock the frequency and phase of the second signal to the frequency and phase of the first signal using the control and functional voltages, the varactor control circuitry 446 may be employed to program the second varactor 410. Thereafter, the control voltage may be applied to the gate terminal 444 of the first varactor 408 and the varactor control circuitry 446 may be employed to apply the functional voltage to the gate terminal 456 of the programmed second varactor 410 such that the modified version of the PLL 200 may lock the frequency and phase of the second signal to the frequency and phase of the first signal.

The configuration of the VCO 400 is exemplary, and therefore, the VCO 400 may include a larger or smaller amount of and/or different circuitry adapted to function as described below. For example, instead of a single tuning varactor 408, a larger number of tuning varactors may be employed. Additionally or alternatively, instead of a single center frequency varactor 410, the second exemplary VCO 400 may include a different number of center frequency varactors.

The VCO 400 may include a plurality of varactors (e.g., an array of varactors). A subset of the plurality of varactors may receive a programming voltage adapted to change capacitances provided thereby, respectively. By configuring the VCO 400 such that only a subset of a plurality of varactors included therein may receive the programming voltage, in some embodiments, the analog multiplexer 216 may be replaced by a programmable level driver (PLD) assuming a functional voltage provided to the subset may be set to a static voltage during functional operation of the modified version of the PLL 200.

Figure 5:
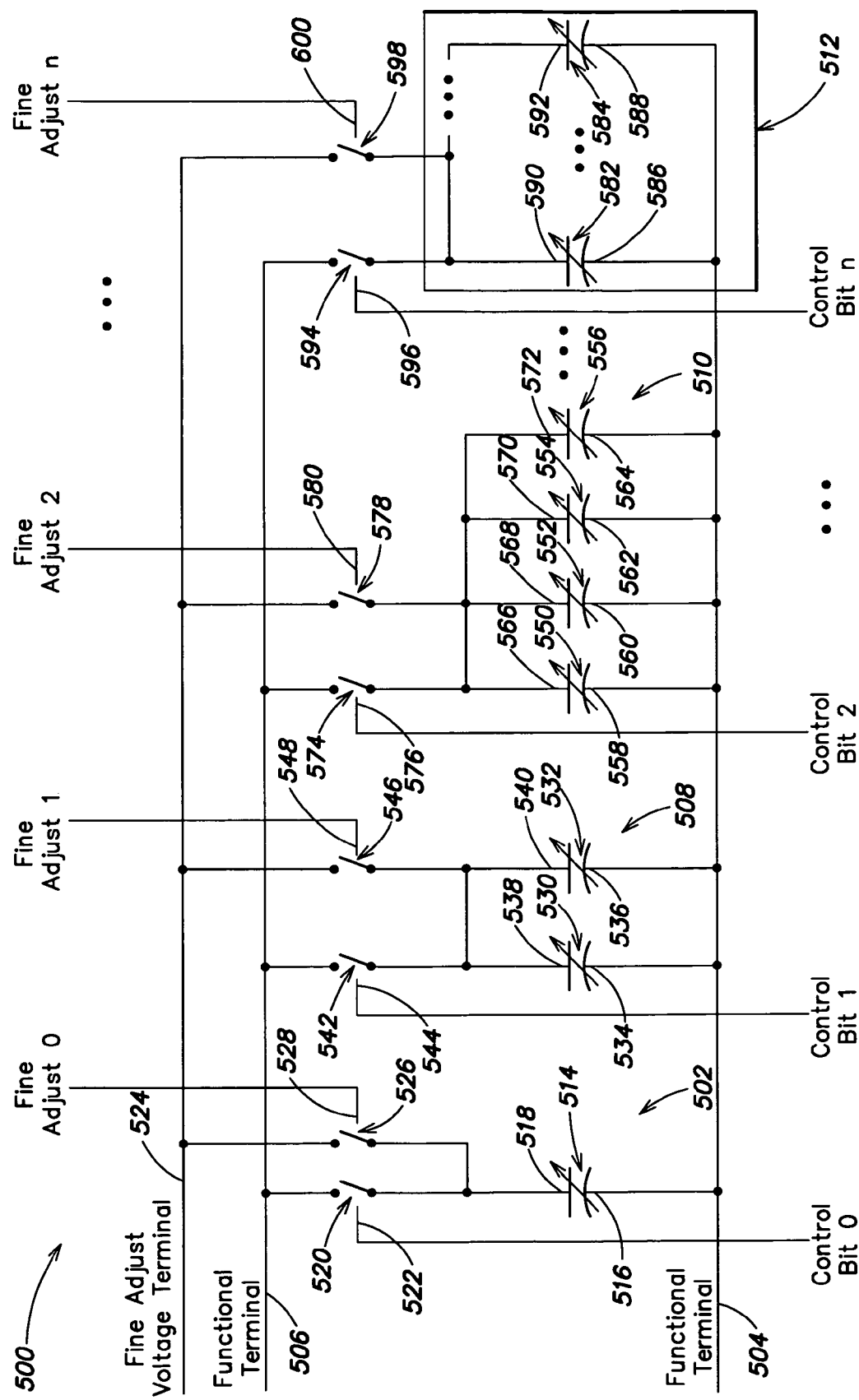
FIG. 5 is a schematic diagram of a capacitor array including at least one programmable capacitor in accordance with an embodiment of the present invention.

Additionally, adjustable capacitors may be employed in a different type of circuit. For example, FIG. 5 is a block diagram of a capacitor array 500 including at least one programmable capacitor in accordance with an embodiment of the present invention. With reference to FIG. 5, the capacitor array 500 may include a plurality of programmable capacitor sets. Each set may include one or more programmable capacitors including a dielectric material having a k of about 3.9 to about 25. For example, the capacitor array 500 may include a first programmable capacitor set 502 coupled across first and second functional terminals 504, 506 of the capacitor array 500. The functional terminals 504, 506 may serve as an output of the capacitor array 500. Further, the capacitor array 500 may include a second programmable capacitor set 508 coupled in parallel with the first programmable capacitor 502, a third programmable capacitor set 510 coupled in parallel with the first and second programmable capacitor sets 502, 508 and so on to an nth programmable capacitor set 512 coupled in parallel with the other sets 502, 508, 510.

The first programmable capacitor set 502 may include a first programmable capacitor 514 having a dielectric material having a k of about 3.9 to about 25. A first input 516 of the first programmable capacitor 514 may be coupled to the first functional terminal 504. A second input 518 of the first programmable capacitor 514 (e.g., a gate terminal thereof) may be coupled to the second functional terminal 506 via a first switch 520 of the set 502. Operation of the first switch 520 is based on a control signal Control Bit 0 input by a control input 522 of the first switch 520. For example, the first switch 520 may close when Control Bit 0 is asserted. Additionally, the second input of the first programmable capacitor 518 may be coupled to a programming terminal (represented as "Fine Adjust Voltage Terminal" in FIG. 5) 524 via a second switch 526 of the first set 502. Operation of the second switch 526 is based on a control signal (represented as "Fine Adjust 0" in FIG. 5) input by a control input 528 of the second switch 526. For example, the second switch 526 may close when Fine Adjust 0 is asserted. In operation, for example, the first switch 520 may be closed by asserting Control Bit 0. Therefore, an overall capacitance of the capacitor array 500 may be based at least on the programmable capacitor 514 in the first set 502. Alternatively, the second switch 526 may be closed by asserting Fine Adjust 0. Consequently, a signal (e.g., voltage) asserted on the programming terminal may be applied to the gate terminal 518 of the first programmable capacitor 514 such that a Vt of the programmable capacitor 514 may change (e.g., from an original Vt to a changed Vt). In this manner, a capacitance subsequently provided by the programmable capacitor 514, and therefore, the first set 502 may be adjusted.

The second programmable capacitor set 508 may include first and second programmable capacitors 530, 532 having a dielectric material having a k of about 3.9 to about 25. Respective first inputs 534, 536 of the first and second programmable capacitors 530, 532 may be coupled to the first functional terminal 504. Respective second inputs 538, 540 of the first and second programmable capacitors 530, 532 (e.g., gate terminals thereof) may be coupled to the second functional terminal 506 via a first switch 542 of the set 508. Operation of the first switch 542 is based on a control signal Control Bit 1 input by a control input 544 of the first switch 542. For example, the first switch 542 may close when Control Bit 1 is asserted. Additionally, the respective second inputs 538, 540 of the first and second programmable capacitors 530, 532 may be coupled to the programming terminal 524 via a second switch 546 of the second set 508. Operation of the second switch 546 is based on a control signal (represented as "Fine Adjust 1" in FIG. 5) input by a control input 548 of the second switch 546. For example, the second switch 546 may close when Fine Adjust 1 is asserted. In operation, for example, the first switch 542 may be closed by asserting Control Bit 1. Therefore, an overall capacitance of the capacitor array 500 may be based at least on the programmable capacitors 530, 532 in the second set 508. Alternatively, the second switch 546 may be closed by asserting Fine Adjust 1. Consequently, a signal (e.g., voltage) asserted on the programming terminal may be applied to respective gate terminals 538, 540 of the first and second programmable capacitors 530, 532 such that a Vt of each such programmable capacitors 530, 532 may change (e.g., from an original Vt to a changed Vt). In this manner, a capacitance subsequently provided by the first and second programmable capacitors 530, 532, and therefore, the second set 508 may be adjusted.

The third programmable capacitor set 510 may include first through fourth programmable capacitors 550-556 having a dielectric material having a k of about 3.9 to about 25. Respective first inputs 558-564 of the first through fourth programmable capacitors 550-556 may be coupled to the first functional terminal 504. Respective second inputs 566-572 of the first through fourth programmable capacitors 550-556 (e.g., gate terminals thereof) may be coupled to the second functional terminal 506 via a first switch 574 of the set 510. Operation of the first switch 574 is based on a control signal Control Bit 2 input by a control input 576 of the first switch 574. For example, the first switch 574 may close when Control Bit 2 is asserted. Additionally, the respective second inputs 566-572 of the first through fourth programmable capacitors 550-556 may be coupled to the programming terminal 524 via a second switch 578 of the third set 510. Operation of the second switch 578 is based on a control signal (represented as "Fine Adjust 2" in FIG. 5) input by a control input 580 of the second switch 578. For example, the second switch 578 may close when Fine Adjust 2 is asserted. In operation, for example, the first switch 574 may be closed by asserting Control Bit 2. Therefore, an overall capacitance of the capacitor array 500 may be based at least on the programmable capacitors 550-556 in the third set 510. Alternatively, the second switch 578 may be closed by asserting Fine Adjust 2. Consequently, a signal (e.g., voltage) asserted on the programming terminal is applied to respective gate terminals 566-572 of the first through fourth programmable capacitors 550-556 such that a Vt of each such programmable capacitor 550-556 may change (e.g., from an original Vt to a changed Vt). In this manner, a capacitance subsequently provided by the first through fourth programmable capacitors 550-556, and therefore, the third set 510 may be adjusted.

The nth programmable capacitor set 512 may include $2^n$ programmable capacitors 582, 584 (only two shown) having a dielectric material having a k of about 3.9 to about 25. Respective first inputs 586, 588 of the first through $2^n$th programmable capacitors 582, 584 may be coupled to the first functional terminal 504. Respective second inputs 590, 592 of the first through $2^n$th programmable capacitors 582, 584 (e.g., gate terminals thereof) may be coupled to the second functional terminal 506 via a first switch 594 of the nth set 512. Operation of the first switch 594 is based on a control signal Control Bit n input by a control input 596 of the first switch 594. For example, the first switch 594 may close when Control Bit n is asserted. Additionally, the respective second inputs 590-592 of the first through $2^n$th programmable capacitors 582, 584 may be coupled to the programming terminal 524 via a second switch 598 of the nth set 512. Operation of the second switch 598 is based on a control signal (represented as "Fine Adjust n" in FIG. 5) input by a control input 600 of the second switch 598. For example, the second switch 598 may close when Fine Adjust n is asserted. In operation, for example, the first switch 594 may be closed by asserting Control Bit n. Therefore, an overall capacitance of the capacitor array 500 may be based at least on the programmable capacitors 582-584 in the nth set 512. Alternatively, the second switch 598 may be closed by asserting Fine Adjust n. Consequently, a signal (e.g., voltage) asserted on the programming terminal is applied to respective gate terminals 590, 592 of the first through nth programmable capacitors 582, 584 such that a Vt of each such programmable capacitors 582, 584 may change (e.g., from an original Vt to a changed Vt). In this manner, a capacitance subsequently provided by the first through nth programmable capacitors 582, 584, and therefore, the nth set 512 may be adjusted.

Therefore, the control signals Control Bit 0-Control Bit n may be employed to adjust (e.g., tune) an overall capacitance of the capacitor array 500. For example, by asserting one or more control signals Control Bit 0-Control Bit n, an overall capacitance of the capacitor array 500 may be adjusted to be based on programmable capacitors included in sets 502, 508, 510, 512 corresponding to such asserted control signals. In this manner, the capacitor array 500 is a binary weighted array of capacitors (e.g., programmable capacitors as described above). Binary selection of the control bits Control Bit 0-Control Bit n may serve to provide a coarse adjustment to the overall capacitance provided by the capacitor array 500 (e.g., provided between the first and second functional terminals 504, 506). Further, an overall capacitance 500 provided by the capacitor array 500 may be adjusted (e.g., fine tuned) by changing a Vt of (e.g., programming) one or more programmable capacitors 514, 530-532, 550-556, 582-584 of the capacitor array 500, and thereafter, asserting a control bit corresponding thereto such that the overall capacitance of the capacitor array 500 may be based on such programmed capacitors. Although the second switches 526, 546, 578, 598 of the programmable capacitor sets 502, 508, 510, 512 are coupled to different control signals Fine Adjust 0, Fine Adjust 1, Fine Adjust 2, Fine Adjust n, in some embodiments, such switches 526, 546, 578, 598 may be coupled to the same control signal, and therefore, all programmable capacitors 514, 530-532, 550-556, 582-584 are programmed at the same time.

As described above, control signals Control Bit 0-Control Bit n serve to provide a coarse adjustment (e.g., an initial adjustment) and control signals Fine Adjust 0-Fine Adjust n serve to provide a fine adjustment to the overall capacitance provided by the capacitor array 500. However, in some embodiments, control signals Fine Adjust 0-Fine Adjust n may serve to provide a coarse adjustment and control signals Control Bit 0-Control Bit n may serve to provide a fine adjustment to the overall capacitance provided by the capacitor array 500. In this manner, an overall capacitance of the capacitor array 500 may be tuned. A size of a smallest unit capacitor (e.g., programmable capacitor) in the capacitor array and a capacitance range that may be created by programming the programmable capacitors 514, 530-532, 550-556, 582-584 may determine whether control signals Control Bit 0-Control Bit n serve to provide the coarse adjustment (e.g., an initial adjustment) and control signals Fine Adjust 0-Fine Adjust n serve to provide the fine adjustment to the overall capacitance provided by the capacitor array 500 or whether control signals Fine Adjust 0-Fine Adjust n serve to provide the coarse adjustment and control signals Control Bit 0-Control Bit n serve to provide the fine adjustment to the overall capacitance provided by the capacitor array 500.

Through use of the present methods and apparatus, varactors having a dielectric material including a dielectric constant of about 3.9 to about 25 may be employed in a variety of circuit designs, such as a PLL 200 a binary weighted capacitor array 500, and/or the like, for example. The varactors including a dielectric material having a dielectric constant of about 3.9 to about 25 may provide a high quality factor (Q-factor) and therefore provide a low-leakage capacitance. Additionally, such varactors provide a wide tuning range. For example, such a varactor may provide a capacitance between about 0.1 fF/1 $\mu m^2$ to about 2.0 fF/$\mu m^2$ (although a larger of smaller and/or different tuning range may be employed). Further, manufacturing of such varactors may easily be integrated into existing CMOS processes (e.g., without a need for additional masks). For example, manufacturing of such varactors may be integrated into methods of manufacturing standard planar CMOS and finFET technologies. More specifically, manufacturing of such varactors may be integrated into methods of manufacturing silicon-on-insulator (SOI) and finFET semiconductor devices where an active silicon layer is insulated from a remaining portion of a substrate (e.g., a bulk silicon region). Due to the high quality factor, a varactor in accordance with embodiments of the present invention, and a circuit (e.g., a varactor array) comprising such a varactor, may provide a built-in or autonomic memory capability such that the varactor may retain state (e.g., store a capacitance). Therefore, a circuit including such a varactor may not require additional circuitry (e.g., non-volatile memory) to store a capacitance.

The foregoing description discloses only exemplary embodiments of the invention. Modifications of the above disclosed apparatus and methods which fall within the scope of the invention will be readily apparent to those of ordinary skill in the art. For instance, varactors having a dielectric material including a dielectric constant of about 3.9 to about 25 employed in a circuit described above may be of the same size. Alternatively, two or more of such varactors may have different sizes.

Accordingly, while the present invention has been disclosed in connection with exemplary embodiments thereof, it should be understood that other embodiments may fall within the spirit and scope of the invention, as defined by the following claims.

The invention claimed is:

1. A method of adjusting capacitance of a semiconductor device, comprising:
providing a transistor including a dielectric material having a dielectric constant of about 3.9 to about 25;
wherein the transistor is adapted to operate in a first mode to provide a capacitance; and
wherein the transistor is adapted to operate in a second mode to change a threshold voltage of the transistor from an original threshold voltage to a changed threshold voltage such that the changed threshold voltage affects the capacitance provided by the transistor; and
employing the transistor in a circuit.

2. The method of claim 1 further comprising operating the transistor in the first mode such that the transistor provides a first capacitance.

3. The method of claim 2 further comprising:
operating the transistor in the second mode to change a threshold voltage of the transistor from the original threshold voltage to a first changed threshold voltage such that the first changed threshold voltage affects the capacitance provided by the transistor when operated in the first mode; and operating the transistor in the first mode such that the transistor provides a second capacitance.

4. The method of claim 3 further comprising:
operating the transistor in the second mode to change the threshold voltage of the transistor from the first changed threshold voltage to a second changed threshold voltage such that the second changed threshold voltage affects the capacitance provided by the transistor when operated in the first mode, wherein the second changed threshold voltage is equal to or approximately equal to the original threshold voltage; and operating the transistor in the first mode such that the transistor provides a third capacitance, wherein the third capacitance is equal to or approximately equal to the first capacitance.

5. The method of claim 1 wherein employing the transistor in a circuit includes employing the transistor in at least one of a voltage-controlled oscillator of a phase-locked loop and a weighted capacitor array.

* * * * *